United States Patent
Li et al.

(10) Patent No.: US 7,385,822 B1
(45) Date of Patent: Jun. 10, 2008

(54) CLIP ASSEMBLY

(75) Inventors: Wei Li, Shenzhen (CN); Yi-Qiang Wu, Shenzhen (CN)

(73) Assignees: Fu Zhun Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/761,177

(22) Filed: Jun. 11, 2007

(51) Int. Cl.
*H05K 7/20* (2006.01)

(52) U.S. Cl. .................. 361/709; 361/704; 361/710; 361/719; 165/80.3; 165/185; 257/727

(58) Field of Classification Search ............... 361/697, 361/704, 710, 719, 709; 165/80.2, 80.3, 165/122, 185; 257/E23.086, 727; 24/626, 24/457, 458, 513
See application file for complete search history.

(56) References Cited

U.S. PATENT DOCUMENTS

| | | | | |
|---|---|---|---|---|
| 5,477,916 A | * | 12/1995 | Lin | 165/80.3 |
| 5,493,475 A | * | 2/1996 | Lin | 361/710 |
| 6,101,091 A | * | 8/2000 | Baik | 361/704 |
| 6,518,507 B1 | * | 2/2003 | Chen | 174/252 |
| 6,788,538 B1 | * | 9/2004 | Gibbs et al. | 361/704 |
| 7,142,429 B2 | * | 11/2006 | Hsieh et al. | 361/710 |
| 7,142,430 B2 | * | 11/2006 | Lee et al. | 361/719 |
| 7,236,369 B2 | * | 6/2007 | Barina et al. | 361/719 |
| 7,301,769 B2 | * | 11/2007 | Li et al. | 361/697 |
| 2003/0210528 A1 | * | 11/2003 | Huang et al. | 361/709 |
| 2006/0291169 A1 | * | 12/2006 | Lee et al. | 361/704 |
| 2007/0115642 A1 | * | 5/2007 | Ho | 361/710 |

* cited by examiner

*Primary Examiner*—Boris Chérvinsky
*Assistant Examiner*—Courtney L Smith
(74) *Attorney, Agent, or Firm*—Jeffrey T. Knapp

(57) ABSTRACT

A clip assembly (30) for mounting a heat sink (20) on a printed circuit board (10) includes a closed annular positioning portion (32) interferingly engaging with the heat sink, a securing portion (34) secured to the positioning portion. The securing portion has a pressing member (340) extending through an opening (320) defined in the positioning portion for resiliently abutting against the heat sink, and two arms (344) extending from free ends of the pressing member with a pair of hooks (342) formed at distal portions of the two arms for engaging with the printed circuit board.

15 Claims, 5 Drawing Sheets

CLIP ASSEMBLY

BACKGROUND OF THE INVENTION

1. Field of the Invention

The present invention relates to a clip assembly for a heat sink, and more particularly to a clip assembly which can readily and securely attach a heat sink to an electronic device.

2. Description of Related Art

A heat sink is usually placed in thermal contact with an electronic package such as a central processing unit (CPU), and transfers heat through conduction away from the electronic package so as to prevent over-heating of the electronic package. Usually, a heat sink is secured to an electronic package by using a clip.

Chinese patent No. 01242181.2 shows a heat sink assembly including a heat sink and a clip securing the heat sink to an electronic component mounted on a printed circuit board. The heat sink comprises a base and a plurality of fins extending from the base. A plurality of grooves is defined between adjacent fins. Two neighboring fins located at two lateral sides of the groove in the middle of the heat sink project a pair of bulges on opposite inner walls thereof. The clip spans across the groove in the middle of the heat sink with a positioning portion received in the middle of the heat sink in a manner such that the positioning portion abuts against the bulges and the base of the heat sink. Two arms extending from two ends of the positioning portion have a pair of hooks engaging with the printed circuit board, thereby securing the heat sink to the printed circuit board.

The clip can prevent the heat sink from sliding with respect to the printed circuit board along an elongated direction perpendicular to the grooves of the heat sink. However, the heat sink is prone to move along a transverse direction relative to the electronic component. This makes it unstable for the heat sink to the electronic component.

What is needed, therefore, is an improved clip assembly which can overcome the above problem.

SUMMARY OF THE INVENTION

A clip assembly for mounting a heat sink on a printed circuit board includes a closed annular positioning portion interferingly engaging with the heat sink, and a securing portion secured to the positioning portion. The securing portion has a pressing member extending through an opening defined in the positioning portion for resiliently abutting against the heat sink, and two arms extending from free ends of the pressing member with a pair of hooks formed at distal portions of the two arms for engaging with the printed circuit board. The positioning portion has a closed annulus enclosing the heat sink interferingly, thus preventing the heat sink from sliding relative to the printed circuit board.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
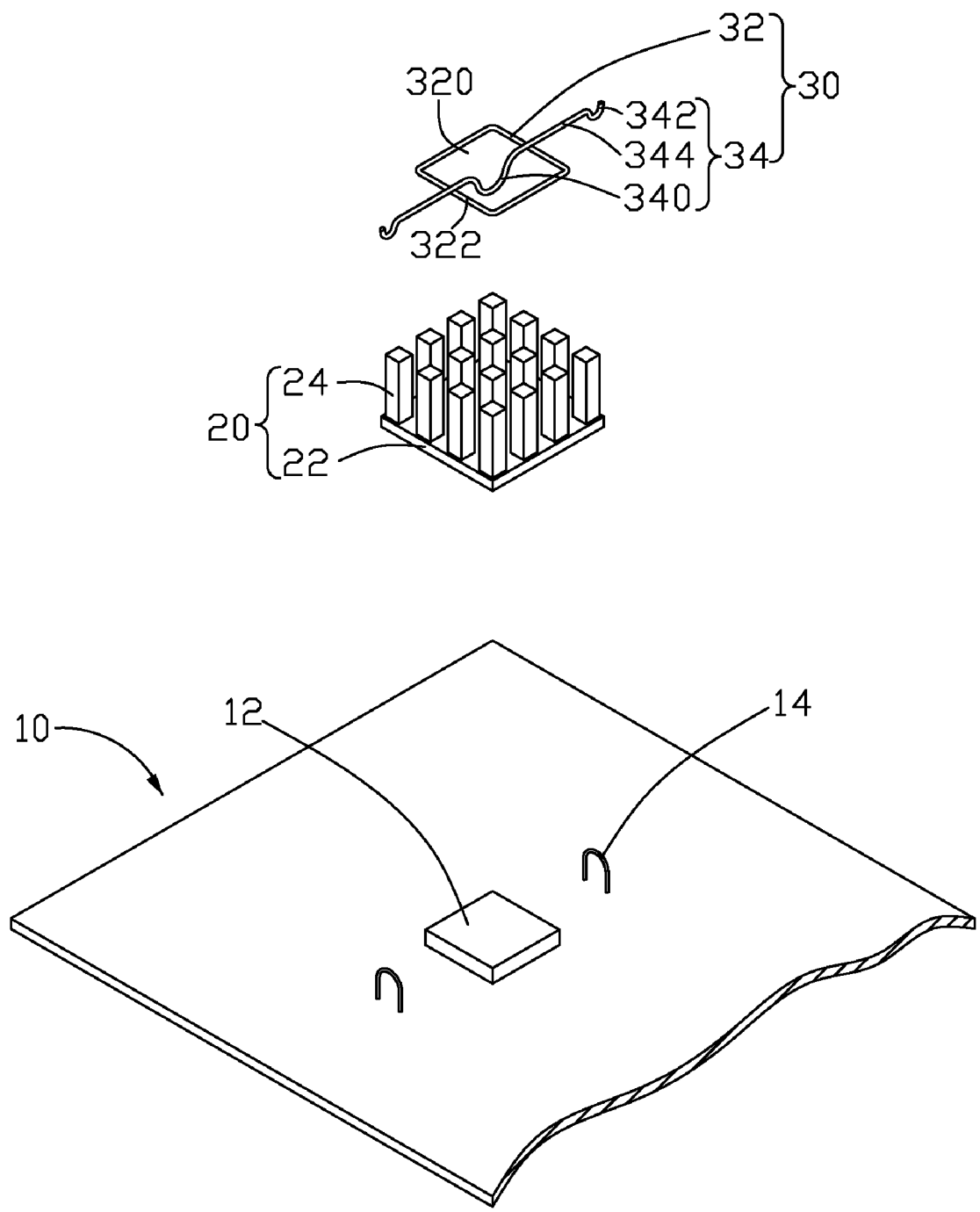
FIG. 1 is an exploded, isometric view of a clip assembly with a heat sink to be mounted on a printed circuit board in accordance with a first preferred embodiment of the present invention.
Figure 2:
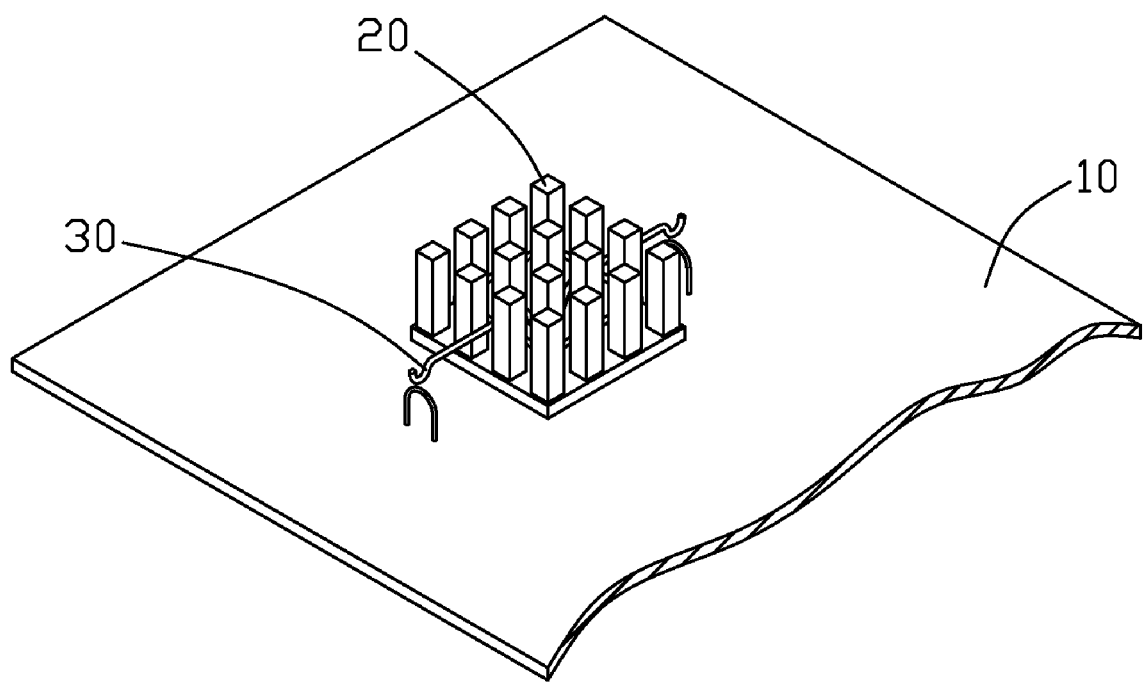
FIG. 2 is an assembled view of FIG. 1.

Referring to FIGS. 1-2, a clip assembly 30 of a first preferred embodiment of the invention is used for securing a heat sink 20 to a printed circuit board 10. The printed circuit board 10 comprises an electronic component 12 mounted thereon and a pair of clasps 14 located on two opposite lateral sides of the electronic component 12.

The heat sink 20 comprises a square base 22 having a bottom face thereof thermally contacting with the electronic component 12, and a plurality of fins 24 extending upwardly and perpendicularly from a top face of the base 22. Each fin 24 of the first preferred embodiment is square column shaped. Neighboring fins 24 are spaced from each other evenly to form a 4×4 array of the fins 24 on the base 22.

The clip assembly 30 is disposed on the heat sink 20, comprising a wire positioning portion 32 and a wire securing portion 34 spanning across the positioning portion 32. The positioning portion 32 encloses a part of the fins 24 of the heat sink 20 and has an interference engagement with a periphery of the part of the fins 24. The positioning portion 32 and the securing portion 34 are made from two resilient wires respectively. The positioning portion 34 is a closed annulus that has four elongated bodies (not labeled) constructing a square frame 322 from beginning to end. The frame 322 is parallel to the base 22 and defines a square opening 320 in a central area thereof.

The securing portion 34 comprises an arced pressing member 340, two elongated straight arms 344 extending outwardly and horizontally from two ends of the pressing portion 340, and a pair of hooks 342 formed at distal portions of the two arms 344. The arms 344 are secured perpendicularly to two opposite bodies of the frame 322 of the positioning portion 32 by soldering respectively, with the arms 344 parallel to other two opposite bodies of the frame 322 of the positioning portion 32. The arms 344 are in line with each other and placed in a common plane as is defined by the frame 32 allowing the pressing member 340 to extend downwardly and perpendicularly through the opening 320 of the positioning portion 32.

Figure 3:
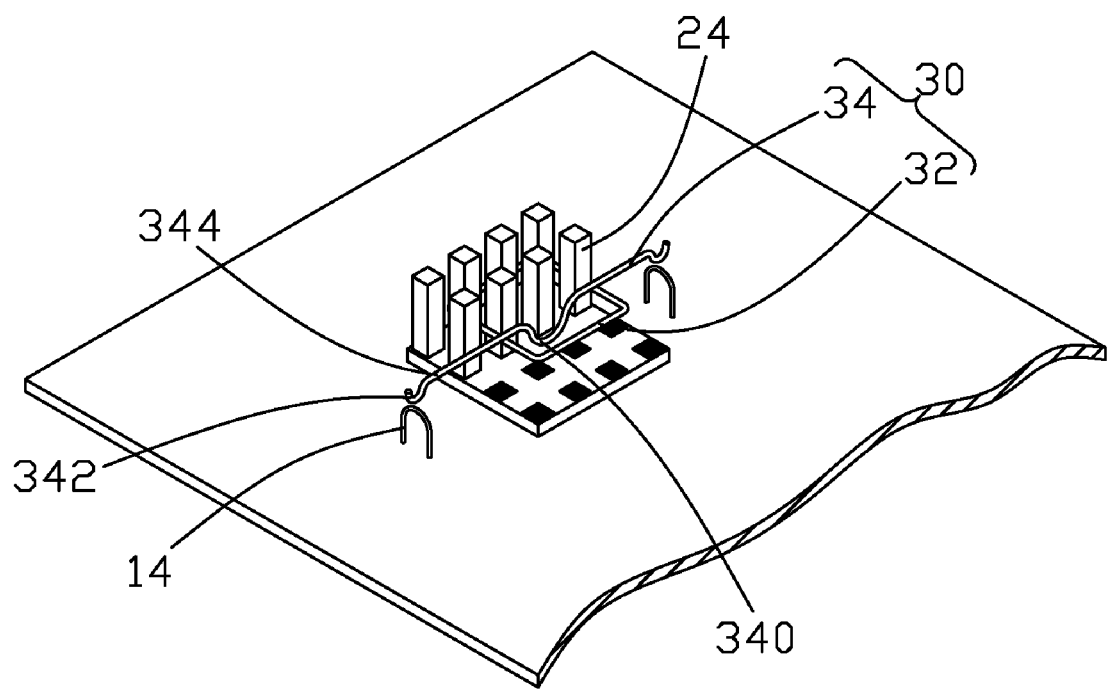
FIG. 3 is an assembled view of FIG. 1 with a part of the heat sink cut away.

Referring to FIGS. 1-3, in use, the clip assembly 30 is disposed above the heat sink 20 with the two hooks 342 being positioned above corresponding clasps 14 of the printed circuit board 10. The clip assembly 30 moves downwardly towards the heat sink 20 until the part of the fins 24 pass through the opening 320 of the positioning portion 32 in a manner such that the part of the fins 24 intimately abut against inner walls of the frame 322 of the positioning portion 32, wherein the pressing member 340 of the securing portion 34 abuts against the top face of the base 22 of the heat sink 20. The hooks 342 of the securing portion 34 are locked into corresponding clasps 342 of the printed circuit board 10 with the pressing member 340 being deformed to exert pressure acting on the base 22 of the heat sink 20, thus holding the heat sink 20 in reliable contact with the electronic component 12.

From the above description of the first embodiment of the present invention, the clip assembly 30 has a closed frame 322 enclosing the fins 24 of the heat sink 20, such that a horizontal removal of the heat sink 20 relative to the printed circuit board 10 can be prevented, and the heat sink 20 has a stable contact with the electronic component 12.

Figure 4:
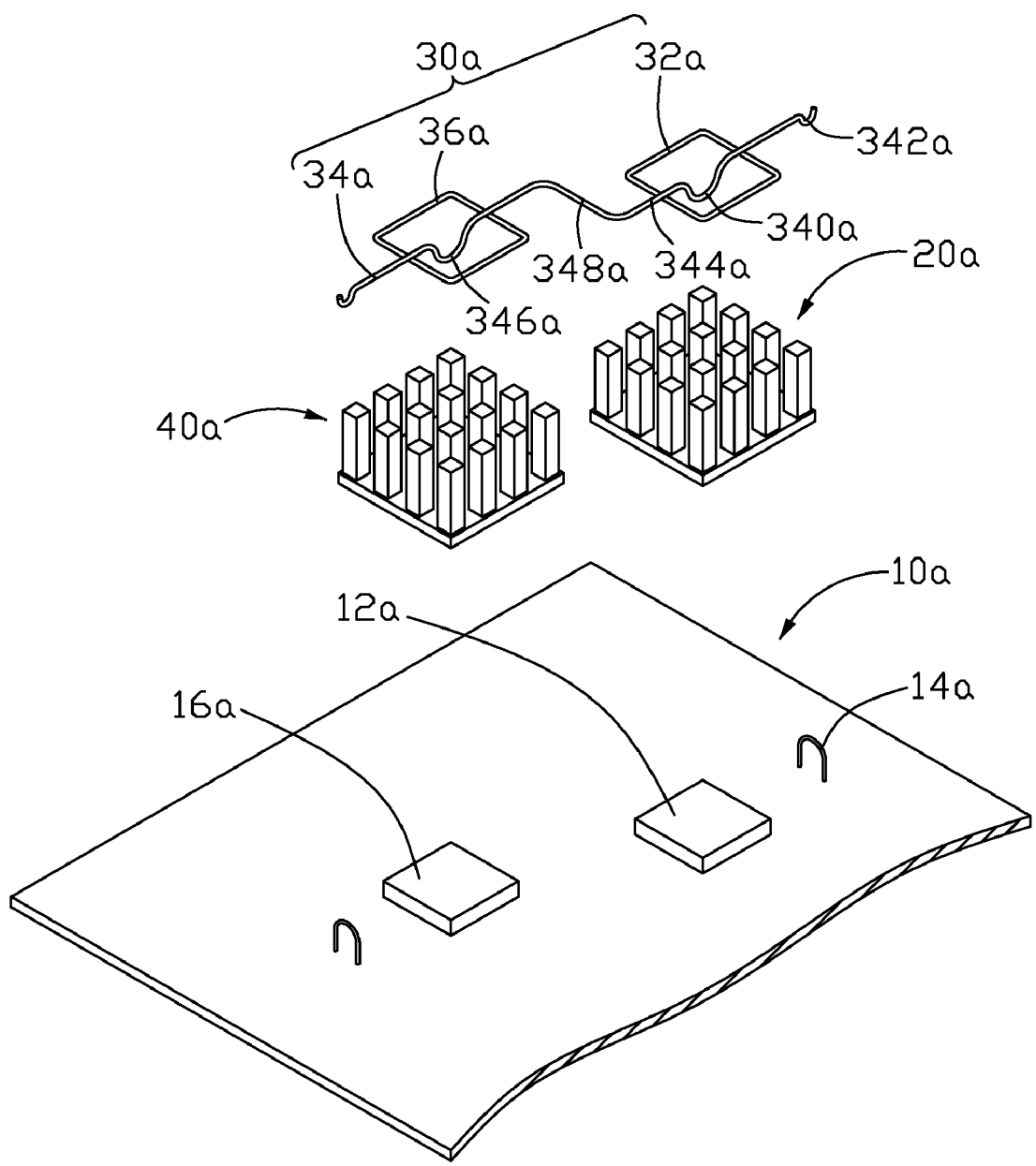
FIG. 4 an exploded, isometric view of a clip assembly with two heat sinks to be mounted on a printed circuit board in accordance with a second preferred embodiment of the present invention.
Figure 5:
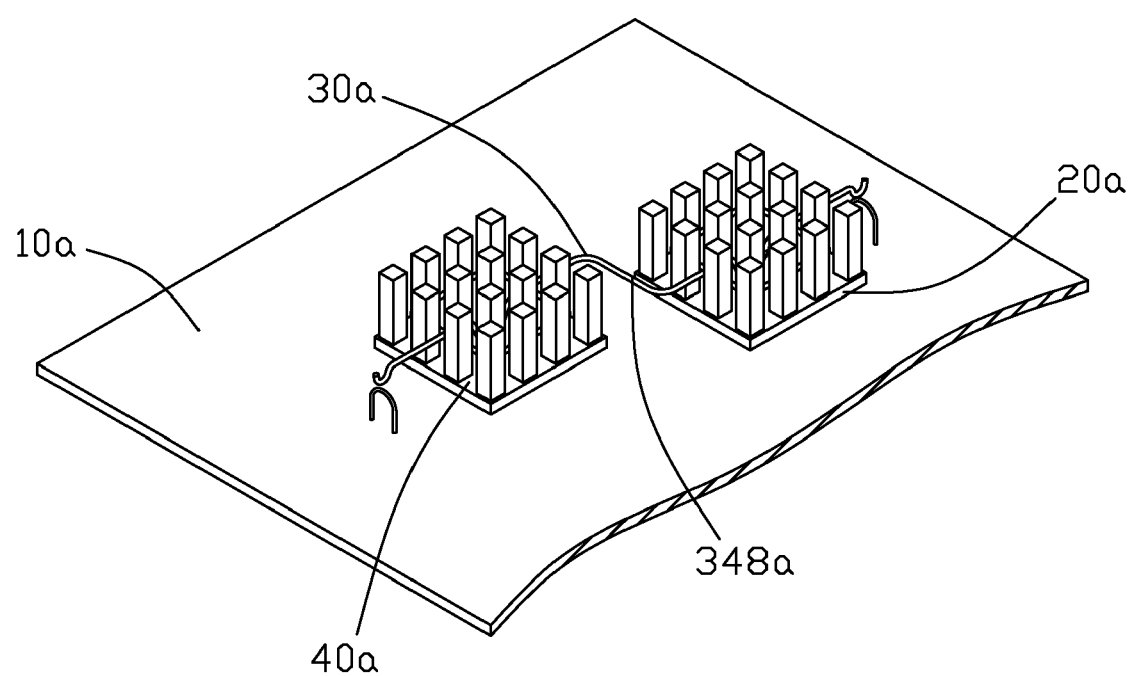
FIG. 5 is an assembled view of FIG. 4.

FIGS. 4-5 show a second preferred embodiment of the present invention. A clip assembly 30a is adapted for attaching two heat sinks 20a, 40a to a pair of electronic components 12a, 16a mounted on a printed circuit board 10a. The clip assembly 30a comprises a pair of wire positioning portions 32a, 36a having the same configuration as the positioning portion 32 of the first preferred embodiment, and a wire securing portion 34a attached to the two positioning portions 32a, 36a by soldering. The positioning portions 32a, 36a are staggered relative to each other. Two securing portions 34 of the first embodiment connect with each other to form the securing portion 34a of the second embodiment. The securing portion 34a comprises a pair of pressing members 340a, 346a. Two elongated arms 344a extend outwardly and horizontally from free ends of each pressing member 340a, 346a, wherein the two arms 344a located outside the two pressing members 340a, 346a form a pair of hooks 342a buckled with clasps 14a of the printed circuit board 10a, the other two arms 344a located between the two pressing members 340a, 346a connect to each other with a perpendicular connecting section 348a therebetween. The length of the connecting section 348a can be changed according to a distance between the two electronic components 12a, 16a. The clip assembly 30a can simultaneously secure the two heat sinks 20a, 40a to the electronic components 12a, 16a; this makes the assembly of the heat sink 20a, 40a to the electronic component 12a, 16a much convenient and rapid.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A clip assembly for mounting a heat sink on a printed circuit board, an electronic component being mounted on the printed circuit board, the clip assembly comprising:
   a wire positioning portion is a wire frame having a closed annular configuration adapted for interferingly engaging with the heat sink; and
   a wire securing portion secured to the positioning portion, comprising a pressing member adapted for resiliently abutting against the heat sink, and two arms extending from the pressing member and spanning across the pressing member are attached on two opposite edges of the frame and extends away from the frame and each arm extends away from the frame and an opening defined by the frame in a manner such that each arm is oriented perpendicular to the edge that the each arm contacts; and the two arms and the frame are located in a common plane; and the pressing member extending downwardly and vertically through the opening of the frame, wherein when the arms engage with the printed circuit board, the pressing member is deformed to perform pressure to the heat sink, thus holding the heat sink in intimate contact with the electronic component.

2. The clip assembly as claimed in claim 1, wherein the pressing member is arced and located between the two arms with two ends of the pressing member connecting with the two arms.

3. The clip assembly as claimed in claim 2, wherein the arms are substantially straight and in line with each other.

4. The clip assembly as claimed in claim 3, wherein a pair of hooks are formed at free ends of the arms for engaging with the printed circuit board.

5. The clip assembly as claimed in claim 1, wherein the positioning portion is a square.

6. The clip assembly as claimed in claim 2, wherein the clip assembly further comprises an additional positioning portion that has a shape essentially identical to the positioning position.

7. The clip assembly as claimed in claim 6, wherein the securing portion further comprises an additional pressing member and two additional arms extending from the additional pressing member, one of the arms and one of the additional arms located between the pressing member and the additional pressing member connecting to each other with a connecting section therebetween, the other one of the arms and the one of the other additional arms located outside the pressing member and the additional pressing member forming a pair of hooks for engaging with the printed circuit board.

8. A heat sink assembly for dissipating heat generated by an electronic device mounted on a printed circuit board, the heat sink assembly comprises:
   a heat sink comprising a base and a plurality of fins extending from the base;
   a clip assembly comprising:
   a wire positioning portion is a wire frame comprising a closed annulus, an opening is defined in the closed annulus; and
   a wire securing portion for engaging with the printed circuit board comprising an arced pressing member, the fins of the heat sink extending through the opening of the positioning portion and abutting against inner sides of the positioning portion, the securing portion being fixed on the positioning portion with the pressing member extending through the opening of the positioning portion and resiliently abutting against the base of the heat sink and two arms extending from the pressing member and spanning across the frame are attached on two opposite edges of the frame and extends away from the frame and each arm extends away from the frame and the opening defined by the frame in a manner such that each arm is oriented perpendicular to the edge that the each arm contacts; and the two arms and the frame are located in a common plane; and the pressing member extending downwardly and vertically through the opening of the frame.

9. The heat sink assembly as claimed in claim 8, wherein two arms extend from two ends of the securing portion in a manner such that a pair of hooks adapted for engaging with the printed circuit board are formed at two free distal portions of the arms.

10. The heat sink assembly as claimed in claim 9, wherein the closed annulus of the positioning portion is a square frame parallel to the base.

11. The heat sink assembly as claimed in claim 10, wherein the arms are parallel to each other and positioned in a common plane the positioning portion defines.

12. A heat sink assembly comprising:
at least a heat sink having a base for thermally connecting with at least an electronic component and a plurality of fins extending upwardly from a top the base; and
a clip comprising:
at least an annular positioning portion is a wire frame enclosing at least some of the fins; and
a securing portion fixed to the at least an annular positioning portion, having an arc-shaped pressing member extending downwards in the annular positioning portion for resiliently engaging the top of the base, and a pair of arms extending outwardly from the pressing member for securing the clip together with the at least a heat sink to the at least an electronic component by fastening with a printed circuit board on which the at least an electronic component is mounted spanning across the frame are attached on two opposite edges of the frame and extends away from the frame; and each arm extends away from an opening defined by the frame in such a manner that each arm is oriented perpendicular to the edge that the each arm contacts; the two arms and the frame are located in a common plane; and the pressing member extending downwardly and vertically through the opening of the frame.

13. The heat sink assembly as claimed in claim 12, wherein the arms each form a hook at a free end thereof.

14. The heat sink assembly as claimed in claim 12, wherein the at least an annular positioning portion of the clip has a quadrilateral shape.

15. The heat sink assembly as claimed in claim 14, wherein the at least an annular positioning portion is square.

* * * * *